(12) United States Patent
Wang et al.

(10) Patent No.: US 10,634,923 B2
(45) Date of Patent: Apr. 28, 2020

(54) HEAD-MOUNTED DISPLAY

(71) Applicants: STARVR CORPORATION, New Taipei (TW); Acer Incorporated, New Taipei (TW)

(72) Inventors: Wei-Chih Wang, New Taipei (TW); Kuan-Lin Chen, New Taipei (TW); Yen-Chou Chueh, New Taipei (TW); Hui-Ping Sun, New Taipei (TW); Chun-Hsien Chen, New Taipei (TW)

(73) Assignees: STARVR CORPORATION, New Taipei (TW); Acer Incorporated, New Taipei (TW)

( * ) Notice: Subject to any disclaimer, the term of this patent is extended or adjusted under 35 U.S.C. 154(b) by 0 days.

(21) Appl. No.: 16/556,242

(22) Filed: Aug. 30, 2019

(65) Prior Publication Data

US 2020/0073130 A1    Mar. 5, 2020

(30) Foreign Application Priority Data

Aug. 31, 2018  (TW) .............................. 107130732 A

(51) Int. Cl.
*G02B 27/01*   (2006.01)
*H05K 7/16*    (2006.01)

(52) U.S. Cl.
CPC ........... *G02B 27/0176* (2013.01); *H05K 7/16* (2013.01); *G02B 2027/0154* (2013.01); *G02B 2027/0169* (2013.01)

(58) Field of Classification Search
CPC ....... G06F 1/163; G06F 1/1637; G02B 27/01; G02B 27/017; G02B 27/0176; G02B 2027/0154
See application file for complete search history.

(56) References Cited

U.S. PATENT DOCUMENTS

| | | | | |
|---|---|---|---|---|
| 3,329,968 A | * | 7/1967 | Gordon ..................... | A42B 3/14 2/418 |
| 4,749,256 A | * | 6/1988 | Bell ..................... | G02B 27/0149 359/632 |
| 4,942,628 A | * | 7/1990 | Freund ................... | A42B 3/145 2/410 |
| 5,331,687 A | * | 7/1994 | Kronenberger .......... | A42B 1/22 2/195.2 |
| 5,357,654 A | * | 10/1994 | Hsing-Chi ............. | A42B 3/145 2/418 |

(Continued)

FOREIGN PATENT DOCUMENTS

TW    M519689    4/2016

*Primary Examiner* — Adrian S Wilson
(74) *Attorney, Agent, or Firm* — JCIPRNET

(57) ABSTRACT

A head-mounted display includes a body, a bearing base, a knob, a guiding element, and a head belt set. The knob is pivoted to the bearing base and located outside the bearing base. The guiding element is pivoted to the bearing base and located inside the bearing base and is configured to be driven by the knob to rotate. The guiding element includes a first gear and a second gear. The head belt set connects the body and the bearing base. The head belt set includes a first side head belt, a second side head belt, and an auxiliary head belt. The first gear is configured to drive the first side head belt and the second side head belt to move. The second gear is configured to drive the auxiliary head belt to move.

8 Claims, 4 Drawing Sheets

(56) References Cited

U.S. PATENT DOCUMENTS

| | | | | |
|---|---|---|---|---|
| 5,950,245 | A * | 9/1999 | Binduga | A42B 3/145 2/183 |
| 6,708,376 | B1 * | 3/2004 | Landry | A42B 3/145 2/418 |
| 7,000,262 | B2 * | 2/2006 | Bielefeld | A42B 3/145 2/418 |
| 7,565,704 | B2 * | 7/2009 | Wu | A42B 3/145 2/410 |
| 7,707,695 | B2 * | 5/2010 | Dubois | A42B 3/145 2/418 |
| 7,854,024 | B2 * | 12/2010 | Fang | A42B 3/145 2/417 |
| 8,056,150 | B2 * | 11/2011 | Stokes | A42B 3/145 2/417 |
| 8,578,521 | B2 * | 11/2013 | Rogers | A42B 3/08 2/417 |
| 10,281,728 | B2 * | 5/2019 | Miller | G02B 27/0176 |
| 10,444,517 | B1 * | 10/2019 | Drinkwater | G02B 27/0149 |
| 2002/0118506 | A1 * | 8/2002 | Saito | G06F 1/163 361/679.03 |
| 2018/0055202 | A1 * | 3/2018 | Miller | G02B 27/0176 |

\* cited by examiner

HEAD-MOUNTED DISPLAY

CROSS-REFERENCE TO RELATED APPLICATION

This application claims the priority benefit of Taiwan application serial no. 107130732, filed on Aug. 31, 2018. The entirety of the above-mentioned patent application is hereby incorporated by reference herein and made a part of this specification.

BACKGROUND

Technical Field

The disclosure relates to a display device, and in particular to a head-mounted display.

Description of Related Art

The so-called virtual reality refers to the use of computer simulation to generate a three-dimensional (3D) virtual environment that provides users with sensory simulations such as sight, smell or touch. As a result, the users can acquire a sensation of immersion as if they are present on the scene.

Generally speaking, the user needs to wear a head-mounted display to obtain the image of the 3D virtual environment. The head-mounted display may be roughly divided into two main parts, that is, a body and a head belt set, and the head belt set may be roughly divided into two side head belts passing over the left side and the right side of the user's head and an auxiliary head belt passing over the top of the user's head. By adjusting the lengths of the two side head belts or the auxiliary head belt, the user is able to control the degree of tightness when wearing the head-mounted display. Although the lengths of the two side head belts may be adjusted synchronously through the same adjustment mechanism, the length of the auxiliary head belt needs to be adjusted through another adjustment mechanism. Therefore, in the case where the lengths of the two side head belts and the length of the auxiliary head belt cannot be synchronously adjusted, the user needs to spend more time adjusting the degree of tightness when wearing the head-mounted display.

SUMMARY

The disclosure provides a head-mounted display that is convenient to use.

A head-mounted display of the disclosure includes a body, a bearing base, a knob, a guiding element, and a head belt set. The bearing base is disposed opposite to the body. The knob is pivoted to the bearing base and located outside the bearing base. The guiding element is pivoted to the bearing base and located inside the bearing base and is configured to be driven by the knob to rotate. The guiding element includes a first gear and a second gear configured to stack on the first gear. The head belt set connects the body and the bearing base, and the head belt set includes a first side head belt, a second side head belt, and an auxiliary head belt. The first side head belt has a first gear rack portion extending into the bearing base, and the second side head belt has a second gear rack portion extending into the bearing base; wherein the second gear rack portion is configured to stack on the first gear rack portion, and the first gear is engaged with a first internal gear rack of the firth gear rack portion and a second internal gear rack of the second gear rack portion. The auxiliary head belt has an auxiliary gear rack portion extending into the bearing base, wherein the auxiliary gear rack portion is configured to stack on the second gear rack portion, and the second gear is engaged with an auxiliary internal gear rack of the auxiliary gear rack portion.

Based on the above, the head-mounted display of the disclosure may synchronously control the movements of the first side head belt, the second side head belt and the auxiliary head belt, so that the degree of tightness may be quickly adjusted when the user wears the head-mounted display. In other words, the head-mounted display of the disclosure is convenient to use.

To make the aforementioned and other features and advantages of the disclosure more comprehensible, several embodiments accompanied with drawings are described in detail as follows.

BRIEF DESCRIPTION OF THE DRAWINGS

The accompanying drawings are included to provide a further understanding of the disclosure, and are incorporated in and constitute a part of this specification. The drawings illustrate exemplary embodiments of the disclosure and, together with the description, serve to explain the principles of the disclosure.

DESCRIPTION OF THE EMBODIMENTS

Figure 1:
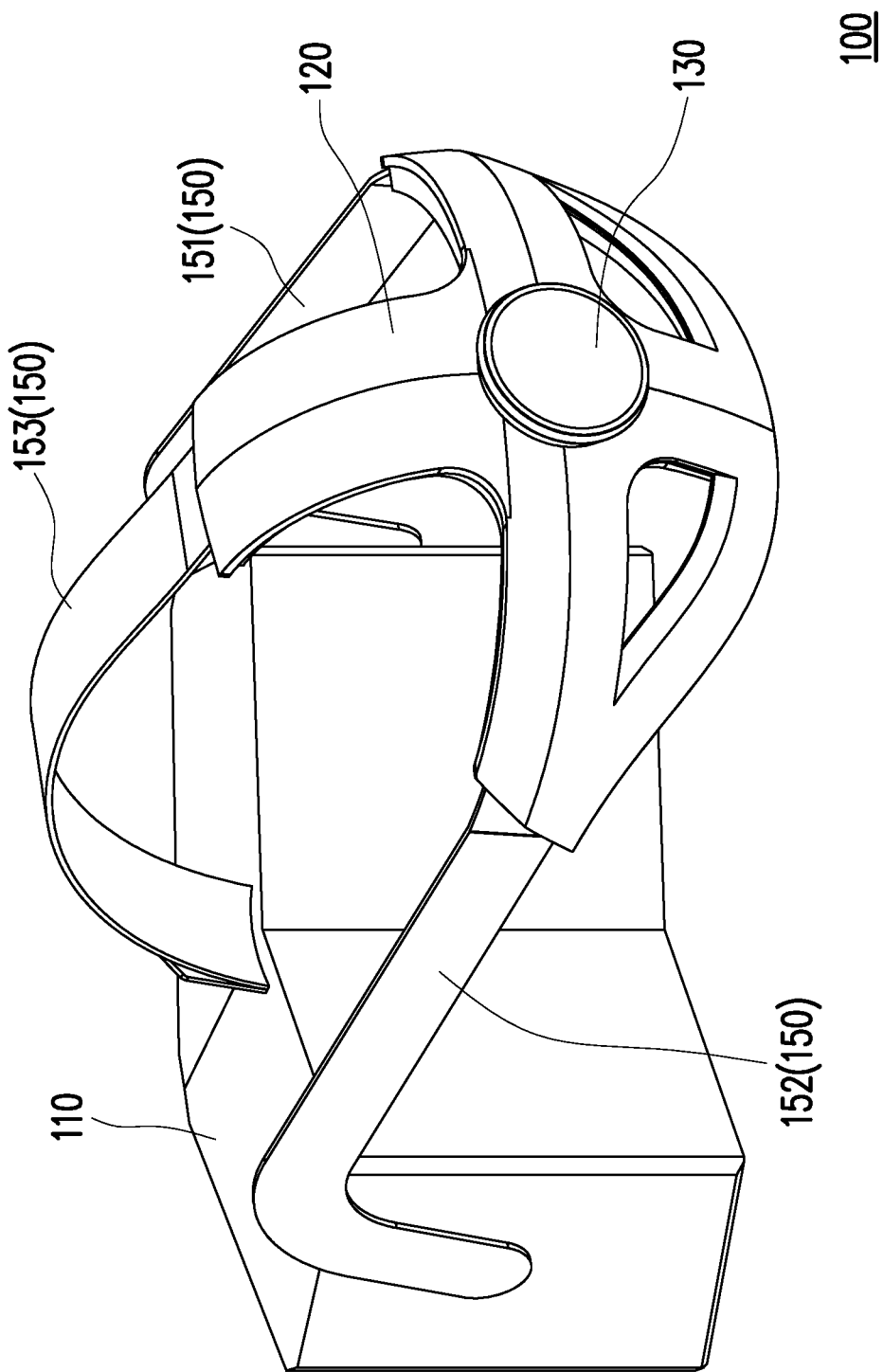
FIG. 1 is a schematic view of a head-mounted display according to an embodiment of the disclosure.
Figure 2:
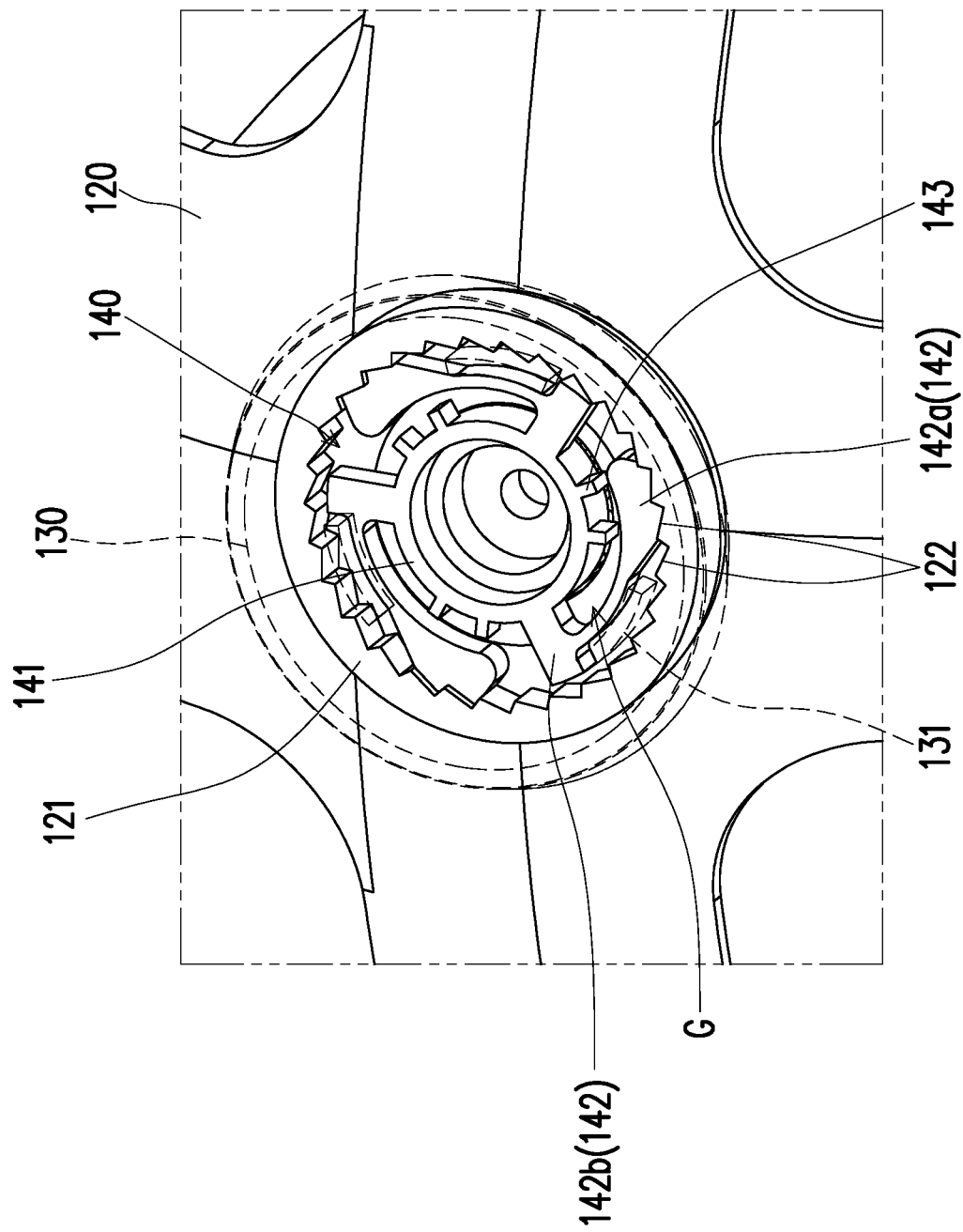
FIG. 2 is a schematic partial enlarged view showing a location of a knob in the head-mounted display according to an embodiment of the disclosure.
Figure 3:
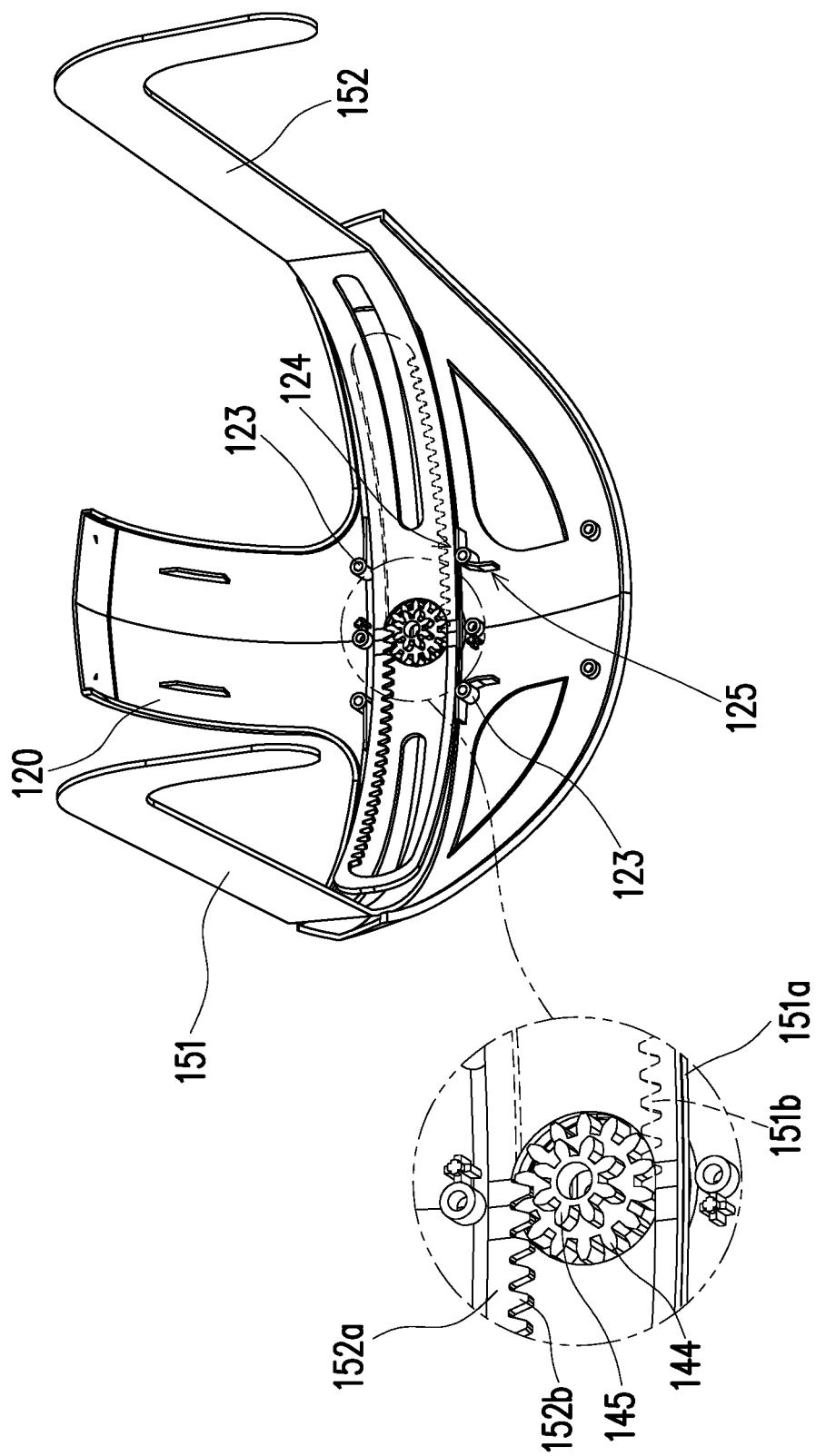
FIG. 3 is a schematic partial enlarged view showing a bearing base, a first side head belt and a second side head belt in the head-mounted display according to an embodiment of the disclosure.
Figure 4:
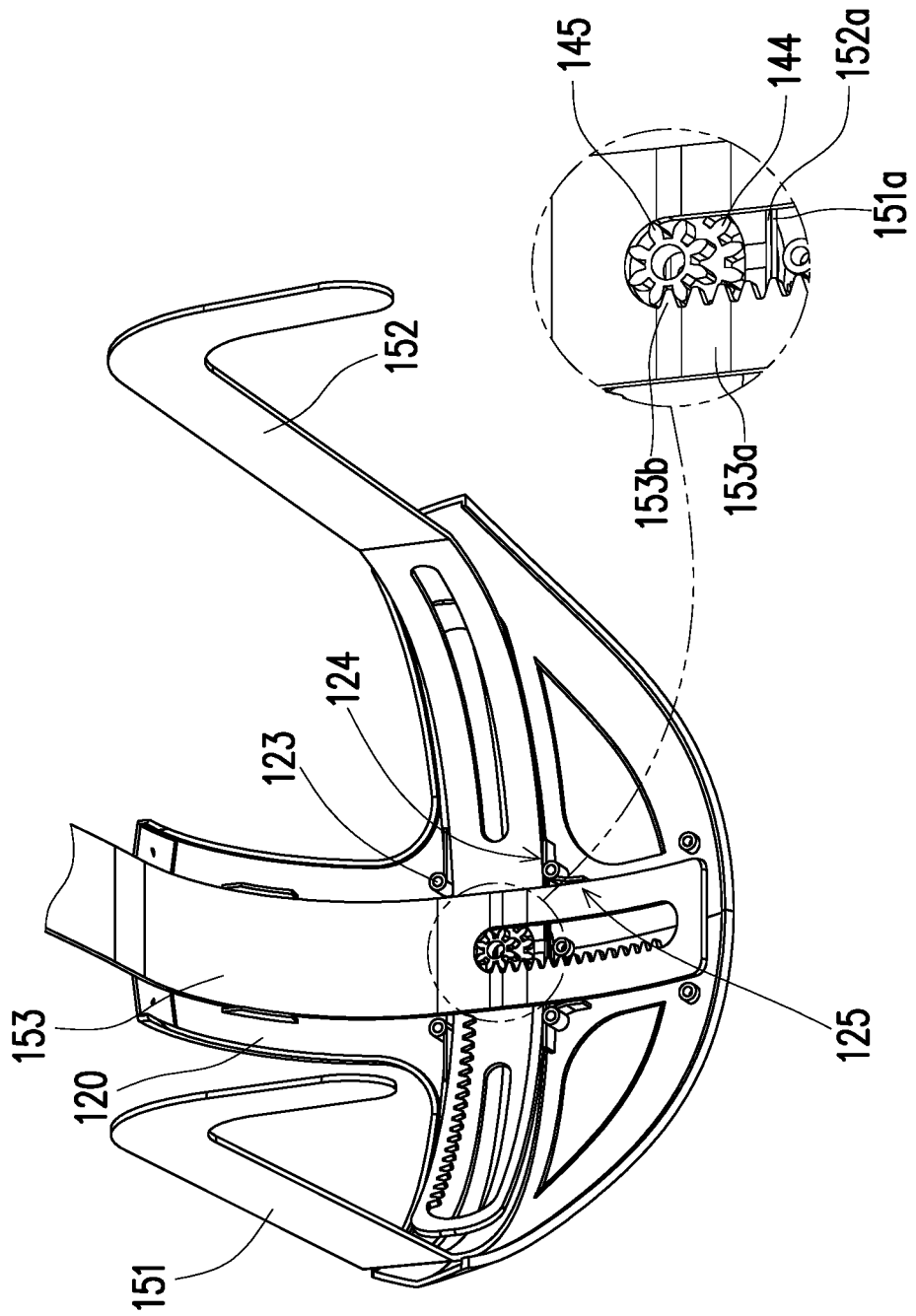
FIG. 4 is a schematic partial enlarged view showing the bearing base, the first side head belt, the second side head belt and an auxiliary head belt in the head-mounted display according to an embodiment of the disclosure.

FIG. 1 is a schematic view of a head-mounted display according to an embodiment of the disclosure. FIG. 2 is a schematic partial enlarged view showing a location of a knob in the head-mounted display according to an embodiment of the disclosure. FIG. 3 is a schematic partial enlarged view showing a bearing base, a first side head belt, and a second side head belt in the head-mounted display according to an embodiment of the disclosure. FIG. 4 is a schematic partial enlarged view showing the bearing base, the first side head belt, the second side head belt, and an auxiliary head belt in the head-mounted display according to an embodiment of the disclosure. Particularly, a knob 130 of FIG. 2 is shown in dashed lines, so as to clearly present the internal structural configuration. FIG. 3 and FIG. 4 omit illustration of a part of the casing of a bearing base 120, so as to clearly present the internal structural configuration.

Referring to FIG. 1 and FIG. 2, in the present embodiment, a head-mounted display 100 includes a body 110, a bearing base 120, a knob 130, a guiding element 140, and a head belt set 150. The body 110 is configured to send and receive signals or information, process signals or information, receive power and display images, and the body 110 is disposed opposite to the bearing base 120. Further, when a user wears the head-mounted display 100, the body 110 is closely placed in front of the user's eyes, and the bearing base 120 is abuts against the back of the user's head. On the other hand, the knob 130 is pivoted to the bearing base 120 and located outside the bearing base 120. In other words, the knob 130 and the body 110 are located at two opposite sides of the bearing base 120, respectively. The guiding element 140 is pivoted to the bearing base 120 and located inside the bearing base 120 and is covered by the knob 130. Further, the knob 130 and the guiding element 140 may be separated from each other or may be abutted against each other due to the rotation of the knob 130. When the knob 130 is rotated to push against the guiding element 140, the guiding element 140 can be rotated synchronously with the knob 130.

The bearing base 120 includes an internal ratchet portion 121. Specifically, the knob 130 is pivoted onto the internal ratchet portion 121 and includes driving portions 131 (which are schematically shown as plural). The driving portions 131 are, for example, bumps that protrude from one side of the knob 130 facing the bearing base 120, and are located inside the internal ratchet portion 121. The guiding element 140 includes a shaft portion 141, a positioning portion 142, and a stopping portion 143. The shaft portion 141 is pivoted to the internal ratchet portion 121 and located inside the internal ratchet portion 121. The positioning portion 142 and the stopping portion 143 are connected to the outer peripheral surface of the shaft portion 141. Specifically, the positioning portion 142 and the stopping portion 143 are located inside the internal ratchet portion 121, and the positioning portion 142 is configured to engage with a plurality of internal ratchet teeth 122 of the internal ratchet portion 121. On the other hand, the number of the positioning portions 142 and the number of the stopping portions 143 may be plural and may be, for example, the same as the number of the driving portions 131. Each positioning portion 142 has an engaging portion 142a and a driven portion 142b opposite to each other. The driven portions 142b and the stopping portions 143 are connected to the outer peripheral surface of the shaft portion 141. Also, each stopping portion 143 is located at one side of the corresponding driven portion 142b, or one stopping portion 143 is disposed between any two adjacent driven portions 142b.

As described above, each engaging portion 142a is connected to the corresponding driven portion 142b and extends to one side of the corresponding stopping portion 143, and engages at least a part of the internal ratchet teeth 122 by one side of the engaging portion 142a facing away from the shaft portion 141. On the other hand, each driving portion 131 is located between the corresponding engaging portion 142a and driven portion 142b. In other words, there is a receding space between each engaging portion 142a and the corresponding driven portion 142b to accommodate the corresponding driving portion 131. For instance, the knob 130 is configured to rotate clockwise or counterclockwise with respect to the bearing base 120. When the knob 130 is rotated clockwise with respect to the bearing base 120, each driving portion 131 rotates with respect to the internal ratchet portion 121 to push the corresponding driven portion 142b to move, so as to drive the guiding element 140 to rotate synchronously along the same direction. When the knob 130 stops rotating, structural interference occurs between the engaging portions 142a and the internal ratchet teeth 122. The structural interference between the engaging portions 142a and the internal ratchet teeth 122 has to be removed before the knob 130 and the guiding element 140 can be rotated clockwise or counterclockwise again with respect to the bearing base 120 depending on the requirements.

When the knob 130 is rotated counterclockwise with respect to the bearing base 120, each driving portion 131 pushes the corresponding engaging portion 142a to move, so as to make the corresponding engaging portion 142a elastically deformed toward the shaft portion 141, which thereby removes the structural interference with the at least a part of the internal ratchet teeth 122. On the other hand, a gap G is maintained between each engaging portion 142a and the shaft portion 141. Each stopping portion 143 is located in the corresponding gap G, and each stopping portion 143 can be used to limit the degree of deformation of the corresponding engaging portion 142a to prevent the engaging portions 142a from being overly deformed. Further, the knob 130 continues to be rotated counterclockwise with respect to the bearing base 120. Each driving portion 131 pushes the corresponding engaging portion 142a to move to drive the guiding element 140 to rotate synchronously along the same direction. When the knob 130 stops rotating, structural interference occurs between the engaging portions 142a and the internal ratchet teeth 122. The structural interference between the engaging portions 142a and the internal ratchet teeth 122 has to be removed before the knob 130 and the guiding element 140 can be rotated clockwise or counterclockwise again with respect to the bearing base 120.

Referring to FIG. 1 to FIG. 4, in the present embodiment, the guiding element 140 further includes a first gear 144 and a second gear 145 configured to stack on the first gear 144. Specifically, the shaft portion 141 passes through the bearing base 120 to connect the first gear 144, and the shaft portion 141, the first gear 144, and the second gear 145 can rotate synchronously. The head belt set 150 connects the body 110 and the bearing base 120, and includes a first side head belt 151, a second side head belt 152, and an auxiliary head belt 153. When the user puts on the head-mounted display 100, the first side head belt 151 and the second side head belt 152 respectively extend by the left and right sides of the user's head, and the auxiliary head belt 153 extends over the top of the user's head. Through adjusting the lengths of the first side head belt 151, the second side head belt 152, and the auxiliary head belt 153, the degree of tightness of the head-mounted display 100 when put on the user can be controlled.

The first side head belt 151 has a first gear rack portion 151a extending into the bearing base 120, and the second side head belt 152 has a second gear rack portion 152a extending into the bearing base 120. Specifically, the second gear rack portion 152a is configured to stack on the first gear rack portion 151a, and the first gear 144 is engaged with a first internal gear rack 151b of the first gear rack portion 151a and a second internal gear rack 152b of the second gear rack portion 152a. On the other hand, the auxiliary head belt 153 has an auxiliary gear rack portion 153a extending into the bearing base 120. Specifically, the auxiliary gear rack portion 153a is configured to stack on the second gear rack portion 152a, and the second gear 145 is engaged with an auxiliary internal gear rack 153b of the auxiliary gear rack portion 153a. Further, the second internal gear rack 152b is located between the first gear rack portion 151a and the auxiliary gear rack portion 153a. The auxiliary gear rack portion 153a is perpendicular to the first gear rack portion 151a and the second gear rack portion 152a, and the first gear rack portion 151a, the second gear rack portion 152a, and the auxiliary gear rack portion 153a can move relatively to each other.

When the knob 130 is rotated clockwise with respect to the bearing base 120, the guiding element 140 is driven by the knob 130 to rotate synchronously. Meanwhile, the first gear 144 and the second gear 145 are rotated synchronously as well. Specifically, the first gear 144 drives the first gear rack portion 151a and the second gear rack portion 152a to move along two opposite directions, respectively, and the second gear 145 drives the auxiliary gear rack portion 153a to move in a direction perpendicular to the first gear rack portion 151a and the second gear rack portion 152a. In other words, with the integrated design of the knob 130 and the double gears (i.e., the first gear 144 and the second gear 145), the user can drive the double gears (i.e., the first gear 144 and the second gear 145) to rotate through rotating the knob 130, and can drive the first side head belt 151, the second side head belt 152, and the auxiliary head belt 153 to move synchronously through the synchronously rotated double gears (i.e., the first gear 144 and the second gear 145), so as to quickly adjust the degree of tightness of the head-mounted display 100 when put on the user.

For example, the gear ratio of the first gear 144 to the second gear 145 may be 7:4. With such a design, during the process of driving the first side head belt 151, the second side head belt 152, and the auxiliary head belt 153 to synchronously move through the synchronously rotated double gears (i.e., the first gear 144 and the second gear 145), the moving amounts of the first side head belt 151 and the second side head belt 152 are larger than the moving amount of the auxiliary head belt 153, so as to fit the contour differences between different regions of the head, such as the contour differences between the left and right sides of the head and the top of the head. In other embodiments, the gear ratio of the first gear to the second gear may be additionally adjusted according to the requirements of design.

In the present embodiment, the bearing base 120 includes a plurality of limiting portions 123 that are located around the first gear 144 and the second gear 145 and are used to define a first limiting channel 124 and a second limiting channel 125 perpendicular to each other. Further, the first gear rack portion 151a and the second gear rack portion 152a are slidably disposed inside the first limiting channel 124, and the auxiliary gear rack portion 153a is slidably disposed inside the second limiting channel 125, so as to increase the stability of the first side head belt 151, the second side head belt 152, and the auxiliary head belt 153 when moving.

Based on the above, with the integrated design of the knob and the double gears in the disclosure, the user may drive the double gears to be rotated by rotating the knob, and the auxiliary head belt, the first side head belt and the second side head belt may be driven to move synchronously by the synchronously rotating double gears. As a result, the degree of tightness may be quickly adjusted when the user wears the head-mounted display. In other words, the head-mounted display of the disclosure is convenient to use.

Although the embodiments are already disclosed as above, these embodiments should not be construed as limitations on the scope of the disclosure. It will be apparent to those skilled in the art that various modifications and variations can be made to the disclosed embodiments without departing from the scope or spirit of this disclosure. In view of the foregoing, it is intended that the disclosure covers modifications and variations provided that they fall within the scope of the following claims and their equivalents.

What is claimed is:

1. A head-mounted display comprising:
    a body;
    a bearing base, disposed opposite to the body;
    a knob, pivoted to the bearing base and located outside the bearing base;
    a guiding element, pivoted to the bearing base and located inside the bearing base and configured to be driven by the knob to rotate, the guiding element comprising a first gear and a second gear stacked on the first gear; and
    a head belt set, connecting the body and the bearing base, the head belt set comprising:
        a first side head belt, having a first gear rack portion extending into the bearing base;
        a second side head belt, having a second gear rack portion extending into the bearing base, wherein the second gear rack portion is configured to stack on the first gear rack portion, and the first gear is engaged with a first inner gear rack of the first gear rack portion and a second inner gear rack of the second gear rack portion; and
        an auxiliary head belt, having an auxiliary gear rack portion extending into the bearing base, wherein the auxiliary gear rack portion is configured to stack on the second gear rack portion, and the second gear is engaged with an auxiliary inner gear rack of the auxiliary gear rack portion.

2. The head-mounted display according to claim 1, wherein the bearing base comprises an internal ratchet portion, the knob is pivoted onto the internal ratchet portion, and the guiding element further comprises a positioning portion, wherein the positioning portion is located inside the internal ratchet portion and is configured to engage with a plurality of internal ratchet teeth of the internal ratchet portion.

3. The head-mounted display according to claim 2, wherein the knob comprises a driving portion located inside the internal ratchet portion, and the positioning portion has an engaging portion and a driven portion opposite to each other, wherein the driving portion is located between the engaging portion and the driven portion, and the driving portion is configured to rotate with respect to the internal ratchet portion to push the driven portion or the engaging portion to move.

4. The head-mounted display according to claim 3, wherein the guiding element further comprises a shaft portion and a stopping portion, and the shaft portion passes through the bearing base to connect the first gear, wherein the driven portion and the stopping portion are connected to an outer peripheral surface of the shaft portion, the stopping portion is located at one side of the driven portion, and the engaging portion is connected to the driven portion and extends to one side of the stopping portion.

5. The head-mounted display according to claim 4, wherein a gap is maintained between the engaging portion and the shaft portion, and the stopping portion is located in the gap.

6. The head-mounted display according to claim 1, wherein the bearing base comprises a plurality of limiting portions located around the first gear and the second gear and configured to define two limiting channels, wherein the first gear rack portion and the second gear rack portion are slidably disposed inside one of the two limiting channels, and the auxiliary gear rack portion is slidably disposed inside the other one of the two limiting channels.

7. The head-mounted display according to claim 1, wherein the auxiliary gear rack portion is perpendicular to the first gear rack portion and the second gear rack portion.

8. The head-mounted display according to claim 1, wherein a gear ratio of the first gear to the second gear is 7:4.

* * * * *